US010182510B2

(12) United States Patent
Obrist (10) Patent No.: US 10,182,510 B2
(45) Date of Patent: Jan. 15, 2019

(54) AUTOMATION MODULE FOR BUILDING AUTOMATION

(71) Applicant: Werner Obrist, Wolfhausen (CH)

(72) Inventor: Werner Obrist, Wolfhausen (CH)

( * ) Notice: Subject to any disclaimer, the term of this patent is extended or adjusted under 35 U.S.C. 154(b) by 0 days.

(21) Appl. No.: 15/506,841

(22) PCT Filed: Jul. 16, 2015

(86) PCT No.: PCT/EP2015/066337
§ 371 (c)(1),
(2) Date: Feb. 27, 2017

(87) PCT Pub. No.: WO2016/030082
PCT Pub. Date: Mar. 3, 2016

(65) Prior Publication Data
US 2017/0257967 A1    Sep. 7, 2017

(30) Foreign Application Priority Data

Aug. 26, 2014    (CH) .................................... 1274/14

(51) Int. Cl.
*H05K 7/14*        (2006.01)
*H02G 3/12*        (2006.01)
(Continued)

(52) U.S. Cl.
CPC ............. *H05K 7/1427* (2013.01); *H02G 3/12* (2013.01); *H05K 1/144* (2013.01); *H05K 1/181* (2013.01);
(Continued)

(58) Field of Classification Search
CPC .......... H02G 3/12; H05K 1/144; H05K 1/181; H05K 2201/042; H05K 2201/09027;
(Continued)

(56) References Cited

U.S. PATENT DOCUMENTS 4,709,205 A * 11/1987 Baurand ............. G01R 15/181
324/127
5,611,691 A *  3/1997 Poulain ................ G09B 23/185
434/219
(Continued)

FOREIGN PATENT DOCUMENTS

DE        299 04 984 U1    11/1999
DE   20 2009 000 673 U1     5/2009
(Continued)

OTHER PUBLICATIONS

Written Opinion issued by the International Bureau in corresponding International Application No. PCT/EP2015/066337, dated Mar. 9, 2017.
(Continued)

*Primary Examiner* — James Wu
(74) *Attorney, Agent, or Firm* — Sughrue Mion, PLLC (57) ABSTRACT

The invention relates to an automation module for building automation, which is designed to be installed in a wall of a house as an at least partially concealed installation. The automation module comprises a high voltage region (6) and a low voltage region (4). It additionally comprises an insulation region (5) for separating said high (6) and low (4) voltage regions, a first circuit board (41, 41') having at least one input interface (411, 414), a second circuit board (42) having at least one control unit (422), and a third circuit board (61) having at least one switching element (611). Said first, second and third circuit boards (41, 41'; 42, 61) and the insulation region (5) are arranged one above the other in layers.

16 Claims, 5 Drawing Sheets

(51) Int. Cl.
    *H05K 1/14* (2006.01)
    *H05K 1/18* (2006.01)
(52) U.S. Cl.
    CPC ......... *H05K 7/1424* (2013.01); *H05K 7/1438* (2013.01); *H05K 2201/042* (2013.01); *H05K 2201/09027* (2013.01); *H05K 2201/10053* (2013.01); *H05K 2201/10151* (2013.01); *H05K 2201/10522* (2013.01)
(58) Field of Classification Search
    CPC .......... H05K 2201/10053; H05K 2201/10151; H05K 2201/10522; H05K 7/1427; H05K 7/1438
    See application file for complete search history.

(56) References Cited

U.S. PATENT DOCUMENTS

| | | | | |
|---|---|---|---|---|
| 2004/0022041 | A1* | 2/2004 | Bergmann | H02M 7/003 361/784 |
| 2008/0038943 | A1* | 2/2008 | Hayakawa | H01R 9/2425 439/76.2 |
| 2010/0020580 | A1 | 1/2010 | Kim et al. | |

FOREIGN PATENT DOCUMENTS

| | | | |
|---|---|---|---|
| DE | 29904984 | * | 5/2009 |
| DE | 20 2011 109 874 | U1 | 8/2012 |
| DE | 10 2012 001 402 | A1 | 8/2013 |
| EP | 2 093 852 | A1 | 8/2009 |
| EP | 2 667 680 | A1 | 11/2013 |
| EP | 2933890 | | 10/2015 |
| FR | 2 925 257 | A1 | 6/2009 |

OTHER PUBLICATIONS

International Search Report for PCT/EP2015/066337 dated Nov. 5, 2015 [PCT/ISA/210].

* cited by examiner

AUTOMATION MODULE FOR BUILDING AUTOMATION

CROSS REFERENCE TO RELATED APPLICATIONS

This application is a National Stage of International Application No. PCT/EP2015/066337, filed on Jul. 16, 2015, which claims priority from Swiss Patent Application No. 1274/14, filed on Aug. 26, 2014, the contents of all of which are incorporated herein by reference in their entirety.

TECHNICAL FIELD

The present invention relates to an automation module for building automation, which is designed for at least partial flush-mounted installation in a wall of a house, and to a building automation apparatus having such an automation module.

PRIOR ART

Various systems for home automation solutions are available on the market. Most of these systems have a star-shaped structure with a central unit arranged in the basement, for example. The various actuators and sensors are connected to the central unit in this case in a wired or wireless manner, for example via radio. The central unit receives the signals from the sensors, processes them and accordingly controls the actuators. Possible sensors are, for example, motion detectors, temperature sensors, humidity sensors, $CO_2$ sensors, rain or wind sensors or light sensors. Loads such as, in particular, the lighting, heating and/or roller blinds are controlled in a timely manner and as required via the actuators or switching elements which may be, for example, relay switches or dimmers. However, ventilation systems, alarm installations or any desired domestic appliances such as coffee machines or radios, for example, may also be connected to the central unit and controlled by the latter.

In the case of such a wired system with a star-shaped structure, the installation effort is relatively great not only in the case of subsequent installation in an existing building but also in the case of a new construction on account of the cable laying and the cabling.

The range of wireless systems is greatly limited on account of the reinforced concrete and further metal which is usually present in buildings, and the use of repeaters is needed to achieve the desired ranges. Wireless systems therefore have a continuous relatively high power consumption which is managed in many systems with the aid of batteries which need to be regularly replaced. In addition, wireless systems give rise to a certain exposure to radiation for the persons in the building.

In addition to the star-shaped systems with the disadvantages mentioned above, there are systems having a plurality of decentralized automation modules which are networked to one another and each form a node in the network structure of the system. An individual node of these decentralized nodes can be respectively connected to a plurality of sensors and may comprise a control unit which is used to control one or more actuators. In such systems, the individual nodes are connected to one another either in a wired manner by means of a data bus or wirelessly via radio.

A building automation system having a plurality of decentralized but internetworked nodes is disclosed in EP 2 667 680 A1, for example.

The cabling is substantially simpler in such decentralized systems. However, the automation modules must each have sufficient space to accommodate the actuators and the electronics, including the control unit. Since the individual automation modules are usually arranged in the living room, flush-mounted installation of the automation module, including all associated electronic components, is additionally desirable for esthetic reasons. However, the space in existing flush-mounted sockets of buildings is generally very restricted, with the result that only a small number of actuators can be arranged in addition to the cables which have already been laid. As a result, the function of the system is accordingly limited, or further flush-mounted sockets have to be used, which entails not only esthetic disadvantages but also usually signifies additional effort.

Apparatuses for building automation which are installed in a flush-mounted manner are disclosed, for example, in DE 10 2012 001 402 A1, DE 20 2009 000 673 U1 or in DE 20 2011 109 874 U1.

DESCRIPTION OF THE INVENTION

An object of the present invention is therefore to provide an automation module for building automation, which, on the one hand, is as compact and space-saving as possible and in which, on the other hand, the greatest possible number of electronic components such as actuators, in particular, can be accommodated.

The present invention therefore provides an automation module for building automation, which is designed for at least partial, preferably even complete, flush-mounted installation in a wall of a house. The automation module has a high-voltage region and a low-voltage region. The automation module also comprises
 an insulation region, in particular an insulation plate, for separating the high-voltage region from the low-voltage region;
 a first printed circuit board having at least one input interface;
 a second printed circuit board having at least one control unit; and
 a third printed circuit board having at least one switching element.

The first, second and third printed circuit boards and the insulation region are arranged above one another in layers in this case.

As a result of the fact that three printed circuit boards and the insulation region are arranged above one another in layers, the automation module can be produced in an extremely compact form and with a high density of electronic components and, in particular, actuators. Thanks to the compact design, the automation module is ideally suitable for flush-mounted installation. In order to install the automation module, an existing light switch can be easily removed and replaced with the automation module, for example. On account of the insulation region which is generally arranged between the printed circuit boards, consequent separation of the low-voltage region and of the high-voltage region can be achieved. As a result, the electronic components belonging to the respective regions do not have to be individually insulated from one another, but rather can be easily arranged on a printed circuit board belonging to the corresponding region.

Electronic components which are designed for voltages of more than 50 V, in particular of more than 100 V, are arranged in the high-voltage region, for example. These electronic components arranged in the high-voltage region are, in particular, actuators, for example relay switches. Electronic components which are designed for voltages of less than 50 V, in particular of less than 48 V, are arranged in the low-voltage region, for example. These electronic components designed for the low-voltage region may be, in particular, momentary-contact switches, a processor or a memory chip.

The insulation region is a region which ensures that the high-voltage region is separated from the low-voltage region in such a manner that the electronic components arranged in the high-voltage region and the electronic components arranged in the low-voltage region cannot influence one another in an undesirable manner. The insulation region is preferably designed in the form of an insulation plate, but could also be designed in the form of an accordingly dimensioned air space, for example.

The input interface may be designed in the form of one or more momentary-contact, switches, for example, and may therefore form an input interface for a human user. LEDs can be used as background lighting on the first printed circuit board in order to illuminate buttons which are arranged above the momentary-contact switches, for example, in any desired color and brightness. This makes it possible to meet different design requirements. The various buttons themselves can also have any desired symbols printed on them or also embossed etc. on them, for example, in order to ensure a good overview of the functionality. However, the input interface may also be in the form of a pushbutton or bus connection terminal, for example, and may therefore form an input interface for a further technical device which in turn may have an interface for inputs by a human user.

The control unit is preferably a processor, in particular a microprocessor. The control unit is generally configured to process signals from the input interface, a data bus and/or sensors which are connected to the automation module. The control unit is also usually configured to control the switching element(s) on the basis of this signal processing in such a manner that a particular state with respect to the loads connected to the automation module is achieved.

The third printed circuit board preferably has a plurality of switching elements. The switching elements are preferably switches, in particular relay switches.

The arrangement of the different electronic components on different printed circuit boards specifically provided for this purpose is not only advantageous with respect to the use of space but also results in electronic components which have the same or similar function being grouped on a corresponding printed circuit board in each case. As a result, the automation module has a functionally modular structure, which enables increased flexibility and easier adaptation of the automation module to a particular situation. For example, the third printed circuit board having the switching elements may be configured for a particular range with respect to the current intensities or voltages to be switched. If the automation module is intended to be used in a different environment having higher or lower current intensities or voltages to be switched, the third printed circuit board can be easily replaced with a different printed circuit board accordingly configured for this situation.

In one preferred embodiment, the insulation region is arranged between the second and third printed circuit boards. The second printed circuit board is additionally preferably arranged between the first printed circuit board and the insulation region.

If the insulation region is arranged between the second and third printed circuit boards, the electronic components of the second and third printed circuit boards are advantageously largely arranged on those sides of the second and third printed circuit boards which are opposite to the insulation region. This makes it possible to make optimum use of the space. In addition, the electronic components are insulated from one another to an even better extent and the insulation region can have smaller dimensions, respectively. Most of all electronic components are preferably even arranged on a side of a respective printed circuit board which is opposite to the insulation region.

A current sensor, in particular an inductive current sensor, is preferably mounted on the first or second printed circuit board. Combining the current sensor with a plurality of switching elements, in particular, in a single device results in various possibilities with regard to the functions of the automation module. The current sensor advantageously has its own, if possible complete, electrical insulation. On account of its own insulation of this type, the current sensor can project through the insulation region. If the insulation region is designed in the form of an insulation plate, the latter preferably has a cutout through which the current sensor projects. The current sensor is therefore preferably connected to the first or second printed circuit board in the low-voltage region, but projects, through the insulation region, into the high-voltage region in order to advantageously measure the power consumption of the loads connected to the automation module there.

At least, one service and/or programming interface is preferably provided on the second printed circuit board. In order to allow access to this service and/or programming interface, the first printed circuit board has at least one continuous access opening which is advantageously arranged directly in front of the service and/or programming interface. As a result of the fact that the service and/or programming interface is not mounted on the first printed circuit board which is usually arranged right at the front, it is largely hidden from an uninformed person and is thereby protected from undesirable manipulation.

The first, second and third printed circuit boards are each advantageously connected to one another by means of accordingly provided electrical plug connections. The first, second and third printed circuit boards can preferably each be separated from one another in a non-destructive manner by releasing these electrical plug connections. The printed circuit boards of the automation module can thereby be easily disassembled and assembled again.

A connection for a data bus which is used to network a plurality of automation modules is preferably provided on the first, second or third printed circuit board, in particular on the first printed circuit board. One of the printed circuit boards, in particular the first printed circuit board, preferably also has one or more HVAC (heating, ventilation, air-conditioning) connections in order to be able to receive and transmit corresponding signals. In order to network a plurality of automation modules, it basically suffices, in one preferred embodiment, to connect the automation modules to one another by means of a four-core cable, for example. The installation effort is therefore relatively low.

A particularly compact and space-saving design and simultaneously relatively simple and cost-effective production of the automation module are achieved if the first, second and third printed circuit boards and, if present, advantageously also the insulation plate each have substantially an octagonal form.

The first, second and third printed circuit boards and, if present, the insulation plate are preferably laterally surrounded by a housing having a continuous housing opening, wherein the housing preferably has an octagonal form. Such a housing is used to optimally protect the printed circuit boards situated therein and their electronic components.

The housing is advantageously formed by a side wall which delimits a housing opening passing through the housing. On account of the continuous housing opening, the housing has an upper housing opening on one side and a lower housing opening on the opposite side. The housing can therefore have the form of a tube which is open on both sides and is preferably octagonal. The boards/plate can be arranged therein, for example, in such a manner chat the first printed circuit, board comes to rest in the region of the upper housing opening and the third printed circuit board comes to rest in the region of the lower housing opening, wherein the second printed circuit board and, if present, the insulation plate are situated in the region between the two housing openings.

The third printed circuit board may have a larger diameter than the first, and second printed circuit boards and, if present, the insulation plate.

The housing advantageously comprises, in the region of the third printed circuit board, a groove which extends on an inner side of the housing along a circumferential direction of the housing and is used to accommodate the third printed circuit board.

The third printed circuit board is preferably surrounded at least partially, advantageously completely, by the groove in the radial direction. The groove is preferably designed in such a manner that it completely accommodates that region of the third printed circuit board by which the third printed circuit board is larger than the first and second printed circuit boards and, if present, the insulation plate. On account of the larger diameter of the third printed circuit board, the latter has a projecting outer region which can be used to insert the third printed circuit board into the groove. The housing can preferably be closed in the region of its lower housing opening by means of the third printed circuit board. The third printed circuit board can therefore be accommodated in the housing by means of the groove. The housing can be advantageously fixed by means of the third printed circuit board and can be clamped, in particular, between the third printed circuit, board and a further plate, in particular a connection plate.

A temperature sensor is advantageously provided in the high-voltage region, in particular on the third printed circuit board. This temperature sensor can be used, in particular, to initiate emergency disconnection of the loads connected to the automation module if a particular limit value is reached.

The invention also provides a building automation apparatus comprising at least one automation module designed as stated above. The building automation apparatus preferably even comprises a plurality of such automation modules which are networked to one another.

BRIEF DESCRIPTION OF THE DRAWINGS

Preferred embodiments of the invention are described below using the drawings which are used only for explanation and should not be interpreted in a restrictive manner. In the drawings.

DESCRIPTION OF PREFERRED EMBODIMENTS

Figure 1:
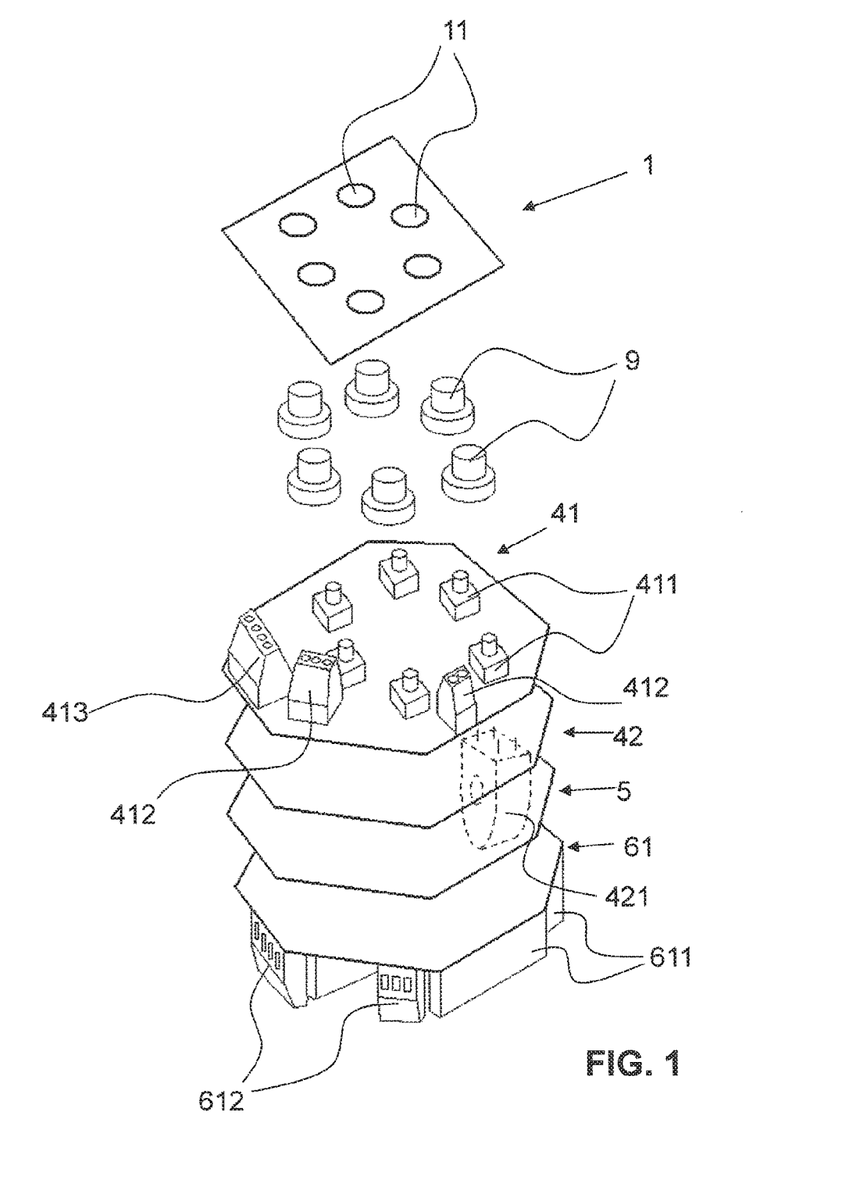
FIG. 1 shows a perspective exploded view of an automation module according to the invention with a housing which has been omitted for representational reasons and with electronic components which are only partially shown.
Figure 2:
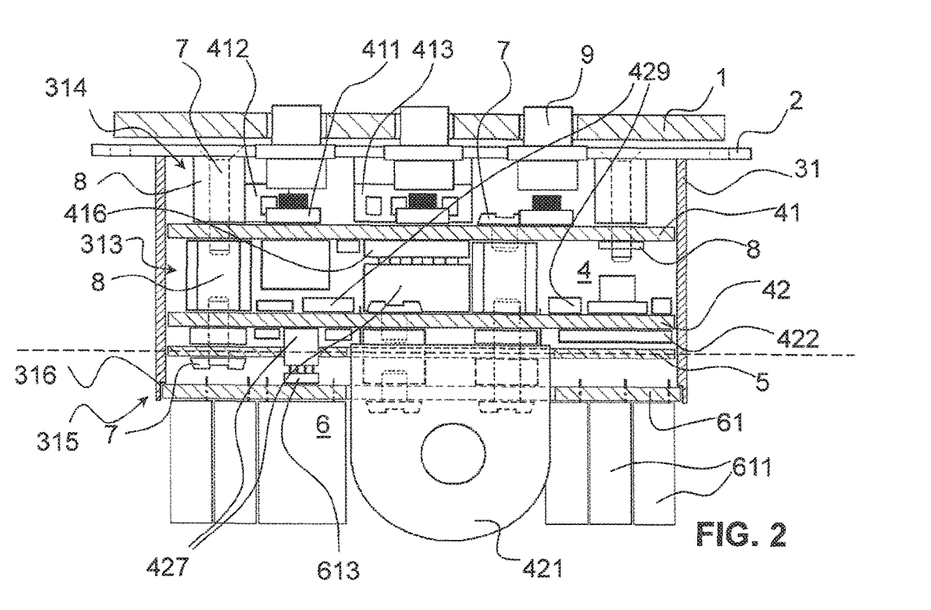
FIG. 2 shows a sectional view through the automation module from FIG. 1.

FIGS. 1 to 7 show an automation module according to the invention for building automation according to one preferred embodiment. The automation module has a first printed circuit board 41 or 41', a second printed circuit board 42, an insulation plate 5 and a third printed circuit board 61 which are arranged above one another in layers. The insulation plate 5 forms an insulation region of the automation module, which region is used to separate a high-voltage region 6 and a low-voltage region 4. The separation region is indicated in FIG. 2 using a dashed line. The first and second printed circuit boards 41 and 42 belong to the low-voltage region 4 and the third printed circuit board 61 belongs to the high-voltage region 6. The entire automation module is designed for complete flush-mounted installation in a wall of a house (not illustrated in the figures).

Both the first, second and third printed circuit boards 41, 42 and 61 and the insulation plate 5 each have substantially a regular octagonal form and are all arranged above one another with the same orientation. All four boards and plate 41, 42, 61 and 5 are accommodated in a housing 3 which has a side wall 31 having a corresponding octagonal form (see FIGS. 2 and 3). The side wall 31 completely surrounds each of the boards/plate 41, 42, 61 and 5. In this case, the side wall 31 defines a housing 3 which is open on both sides and has a continuous housing opening 313 inside which the boards/plate 41, 42, 61 and 5 are arranged. It is very clear from FIG. 2 that the automation module overall has an extremely compact and space-saving configuration. The automation module has a large number of electronic components which are accommodated in a very tight space. The entire automation module fits into an individual flush-mounted socket (not illustrated in the figures), as occurs as standard in buildings.

The first printed circuit board 41, the second printed circuit board 42, the insulation plate 5 and a third printed circuit board 61 are connected to one another by means of screws 7 and threaded sleeves 8. The threaded sleeves 8 are also used as spacer sleeves in order to stipulate the distances of the boards/plate 41, 42, 5 and 61 relative to one another. The screws 7 and threaded sleeves 8 are advantageously produced from an electrically non-conductive plastic material in order to ensure the electrical insulation between the boards/plate 41, 42, 5 and 61.

The first and third printed circuit boards 41 and 61 are connected to the second printed circuit board 42 via electrical plug connections between connecting plugs 416, 613 and connecting sockets 427. The boards/plate 41, 42, 5 and 61 can be separated from one another in a non-destructive manner by releasing the screws 7 and pulling apart the electrical plug connections 416, 613 and 427, which may be advantageous for possible repair work, for example.

The automation module is fastened to a wall of a house or to a flush-mounted socket fitted in the wall of the house by means of a connection plate 2. In this case, the connection plate 2 rests on the surface of the wall and is screwed tightly into the wall of the house or the flush-mounted socket by means of screws. For this purpose, corresponding screw holes are provided on the connection plate 2. The first printed circuit board 41, and therefore the entire automation module, is fastened to the connection plate 2 by means of a further screw 7 and threaded sleeve 8.

A front plate 1 is screwed to the front side of the connection plate 2. The front plate 1 has openings 11 into which buttons 9 are inserted. The buttons 9 can be used by the users to select different functions of the automation module, for example to switch the lighting on and off.

Figure 3:
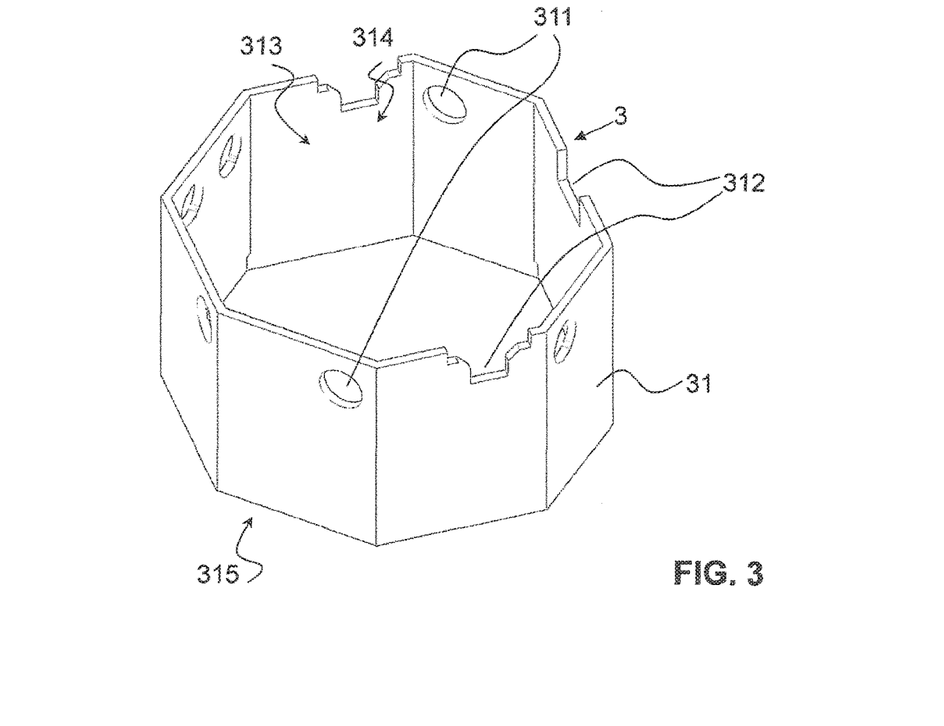
FIG. 3 shows a perspective view of the housing of the automation module from FIG. 1.

The housing 3 which is shown in FIG. 3 and is advantageously produced from a plastic is formed by the octagonal side wall 31 and thereby obtains its octagonal form. The housing opening 313 which passes through the housing 3 defines an upper housing opening 314 and a lower housing opening 315 in this case, with the result that the housing 3 has substantially the form of an octagonal tube which is open on both sides. In the region of its front edge, the side wall 31 has three recesses 312 which are open to the front and are used to fasten the connection plate 2 and to place the upper, central button 9.

In the region of its upper edge, the side wall 31 of the housing 3 also has openings 311 which are arranged in such a manner that, during intended use, they are arranged at the level between the connection plate 2 and the first printed circuit board 41. The openings 311 are used as a cable bushing to the printed circuit board 41 in order to connect the automation module to a data bus, a supply for the low-voltage region 4 and/or an HVAC (heating, ventilation, air-conditioning) cable, for example.

On an underside of the housing 3, in the region of its lower edge, the side wall 31 has a groove 316 which extends on an inner side of the housing 3 along the circumferential direction of the housing 3 and forms a receptacle for the third printed circuit board 61. The groove 316 is open radially inward and downward. As is clear from FIG. 2, in particular, the third printed circuit board 61 has a diameter which is larger than that of the other boards/plate 41, 42, 5. The resulting region of the third printed circuit board 61 which projects in comparison with the printed circuit boards 41, 42, 5 is used to insert the third printed circuit board 61 into the groove 316. Furthermore, the recess of the groove 316 corresponds substantially to the thickness of the third printed circuit board 61 along a longitudinal direction extending perpendicular to the planes of the printed circuit boards, with the result that the larger region of the third printed circuit board 61 is completely accommodated in the groove 316. The groove 316 makes it possible to accommodate the third printed circuit board 61 in the housing 3 with an accurate fit, as a result of which the housing 3 is closed in the region of its lower housing opening 315 and is clamped with respect to the connection plate 2 on account of the boards/plate 5, 41 and 42 which are connected to one another by means of the screws 7 and threaded sleeves 8.

FIGS. 4a to 7 show the first printed circuit board 41 or 41', the second printed circuit board 42, the insulation plate 5 and the third printed circuit board 61 separately from one another, each in a plan view from the front. Electronic components which are mounted on the front side of a board 41, 42 or 61 are each represented in these FIGS. with solid lines. Components arranged on the rear side are each depicted using dashed lines.

Figure 4A:
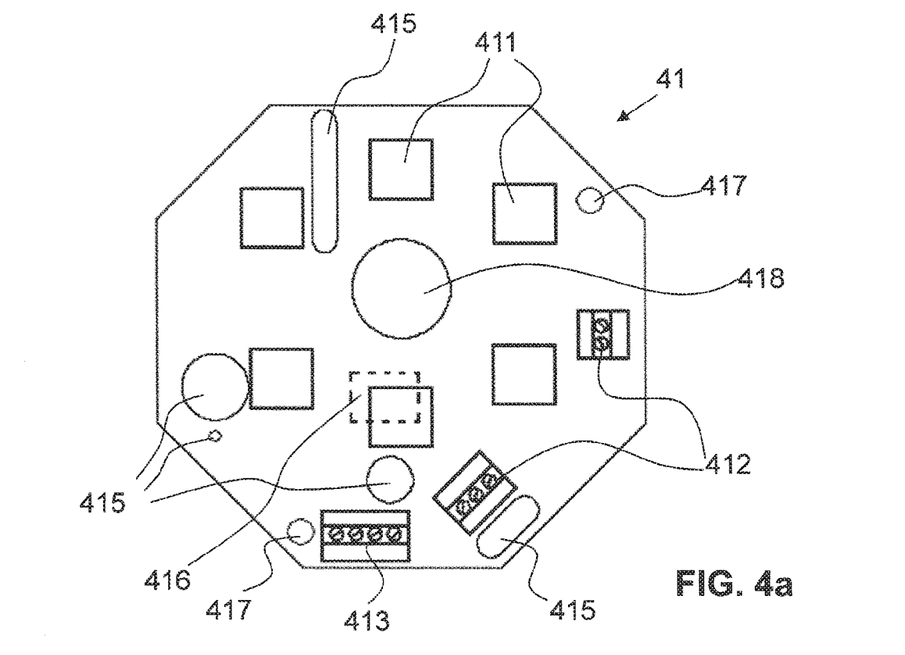
FIG. 4a shows a plan view from the front of a first embodiment of the first printed circuit board of the automation module from FIG. 1.

FIG. 4a shows a first embodiment of the first printed circuit board 41. In this embodiment, momentary-contact switches 411 are mounted on the front side of the first printed circuit board 41. The momentary-contact switches 411 are each arranged directly behind the buttons 9, with the result that the momentary-contact switches 411 can be operated by pressing the buttons 9 in order to select different functions or states of the automation module. LEDs can also be used on the first printed circuit board 41 as background lighting in order to illuminate the buttons 9 arranged above the momentary-contact switches 411 in any desired color and brightness. This makes it possible to meet different design requirements. The different buttons 9 themselves may also nave any desired symbols printed on them or also embossed etc. on them, for example, in order to ensure a good overview of the functionality.

The first printed circuit board 41 also has two HVAC connection terminals 412 on its front side in order to enable corresponding electrical connections for networking to the HVAC system. For example, it is also possible to connect one or more temperature, moisture and/or $CO_2$ sensors accommodated in an adjacent flush-mounted socket to one of the HVAC connection terminals 412.

A bus connection terminal 413 is also arranged on the front side of the first printed circuit board 41 and is used to connect the automation module to a data bus, for example in the form of a multicore cable. A data bus connected to the bus connection terminal 413 can be used to network a plurality of automation modules which may be positioned in different rooms, in particular. The connection terminal 413 can also be used to connect a low-voltage supply for supplying energy to the low-voltage region 4. The supply can be effected, for example, using the same cable which also forms the data bus for networking a plurality of automation modules. On account of the fact that the electronic components are consequently separated into a high-voltage region and a low-voltage region, the power consumption of the automation module can be minimized overall (approximately 0.3 W per automation module in the present embodiment). The Modbus RTU protocol is preferably used as the communication protocol for the data bus.

A multi-core connecting plug 416 which is used to establish electrical connections to the second printed circuit board 42 is mounted on the rear side of the first printed circuit board 41.

The first printed circuit board 41 also has two elongate and two circular access openings 415, two screw holes 417 and a circular cutout 418. The two elongate access openings 415 allow access, from the front side of the automation module inserted into a flush-mounted socket, to the programming and service interfaces 423 and 424 arranged on the second printed circuit board 42. The two circular access openings 415 are used as access to a HEX switch 426 arranged directly behind them on the second printed circuit board 42, on the one hand, and as a viewing window for a light-emitting diode 425 which is likewise arranged on the second printed circuit board 42. The two screw holes 417 are used to establish screw connections to the second printed circuit board 42. The cutout 418 creates space for a screw which is not shown in the figures and is used to fasten the front plate 1 to the connection plate 2.

Figure 4B:
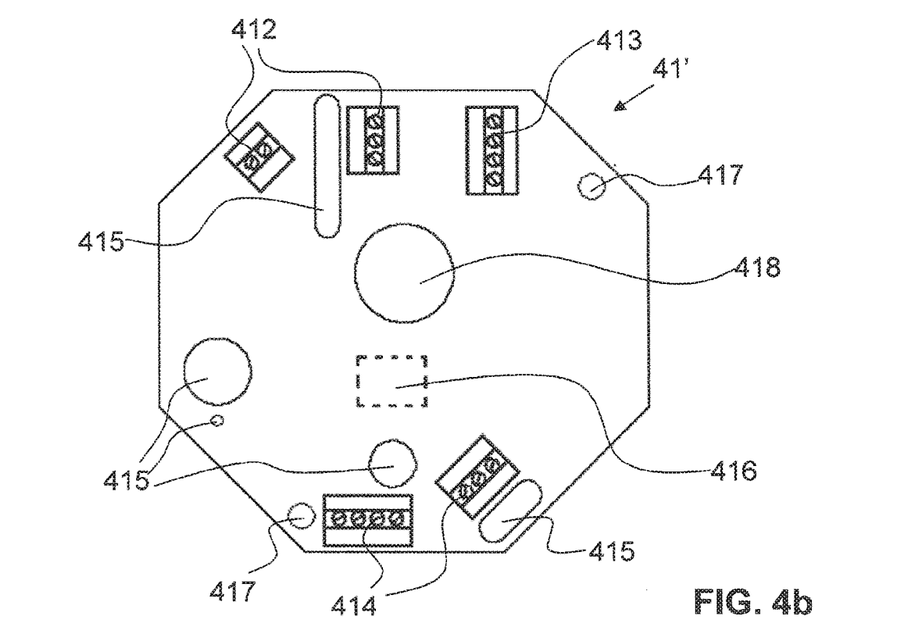
FIG. 4b shows a plan view from the front of a second embodiment of the first printed circuit board of the automation module from FIG. 1.

FIG. 4b shows a first printed circuit board 41' according to an alternative embodiment. The printed circuit board 41' differs from the printed circuit board 41 shown in FIG. 4a in that it has pushbutton connection terminals 414 instead of momentary-contact switches 411. One or more pushbuttons can be connected to the pushbutton connection terminals 414, for example. These external pushbuttons can also be fitted on a further printed circuit board which is in a different flush-mounted socket. However, it is also possible to use the normal (possibly already existing) pushbuttons for light and roller blinds/Venetian blinds, which can likewise be placed in a different flush-mounted socket. It would also be conceivable to connect a radio receiver to the pushbutton connection terminals 414 or to the service interface 424. The radio receiver could be used to receive button signals from a button module arranged in a manner remote from the automation module. In this case, the additional button module would be equipped with a corresponding radio transmitter.

Figure 5:
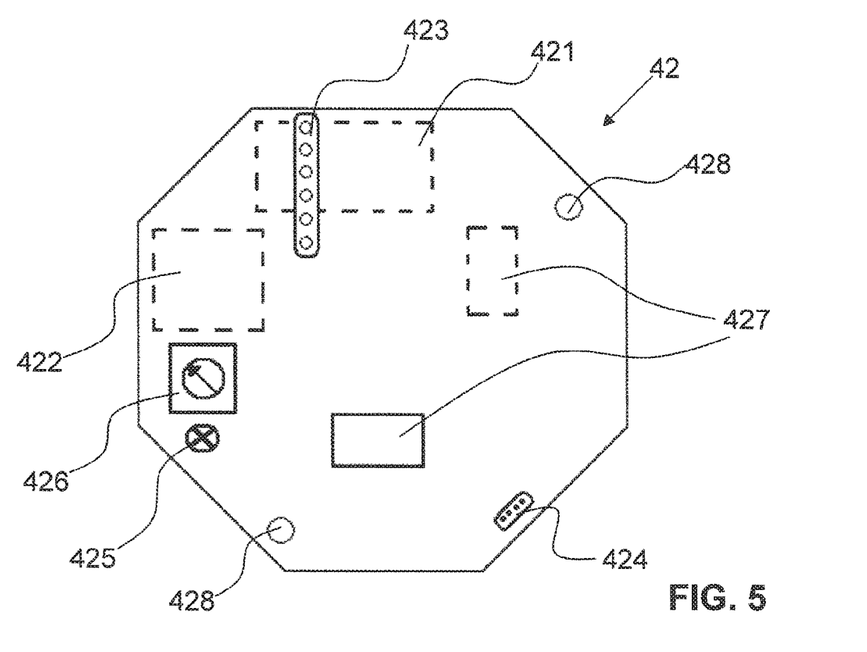
FIG. 5 shows a plan view from the front of the second printed circuit board of the automation module from FIG. 1.

The configuration of the second printed circuit board 42 is clear from FIG. 5. An inductive current sensor 421 is mounted on the rear side of the printed circuit board 42. The current sensor 421 which can also be seen in FIGS. 1 and 2 has its own electrical insulation and, in the present embodiment, is therefore the only electronic component which projects through the insulation plate 5 in addition to the electrical connection 427, 613. The current sensor 421 surrounds a passage opening through which the power supply cable of the respective automation module can be guided in order to record the total current value and the individual current values of the loads connected to the automation module. The actuators 611 mounted on the third printed circuit board 61 are supplied with voltage by this power supply cable.

The current value of an individual electrical load is determined by forming the difference of the respective settled value of the total current before and after switching an actuator 611. Upon switching off an actuator, the respective current value is reset to 0 again, with the result that possible offsets and drifts of the current measurement are also automatically compensated for again.

The detailed energy consumption of an entire building can therefore be determined in a relatively simple manner at the push of a button if the automation modules are accordingly installed and networked to one another.

A processor 422 which forms a control unit and is used to control the actuators 611 is also mounted on the rear side of the second printed circuit board 42. A memory chip (not shown in the figures) can also be fitted to the second printed circuit board 42, for example if the processor itself has too little internal memory. The memory is used to store different possible and instantaneous states of the automation module. The memory can store states not only of its own automation module but also of further automation modules networked to this automation module. The signals last received from the momentary-contact switches 411 and from the sensors and the data bus via the connection terminals 412, 413, 414 can also be stored in the memory chip. The function assignment of the momentary-contact switches 411 can also be defined in the memory. The information stored in the memory can be advantageously changed by means of corresponding instructions via the programming interface 423 or the bus connection terminal 413, for example, with the result that the function of the automation module can be adapted at any time by an informed person or the end user.

A programming interface 423 and a service interface 424 are arranged on the front side of the second printed circuit board 42 and can be used by an informed person to adapt the automation module to the current requirements by means of appropriate reprogramming and/or to carry out service work on the module. A HEX switch 426 is likewise mounted on the front side of the second printed circuit board 42 for these purposes. A light-emitting diode 425 is used as a status light to indicate the state of the automation module. Further electronic components 429 can be provided on the front side or rear side of the second printed circuit board 42.

Multi-core connecting sockets 427 are respectively arranged on the front and rear sides of the second printed circuit board 42 in order to be able to establish electrical plug connections to the first printed circuit board 41 or 41' and the third printed circuit board 61.

Screw holes 428 formed in the second printed circuit board 42 are used to guide through screws 7 in order to tightly screw the first and third printed circuit boards 41, 41' and 61 and the insulation plate 5 to the second printed circuit board 42.

Figure 6:
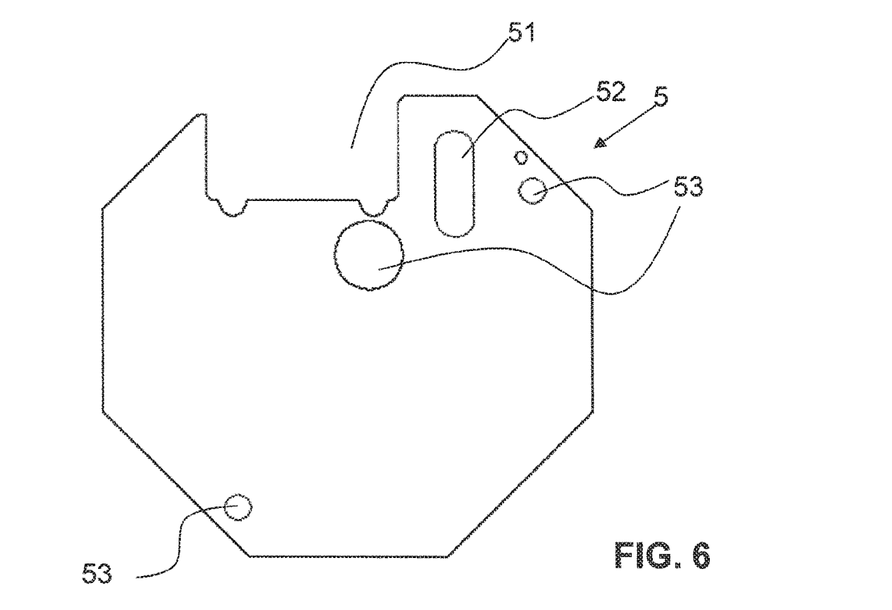
FIG. 6 shows a plan view from the front of the insulation plate of the automation module from FIG. 1.

The insulation plate 5 shown in FIG. 6 is produced from an electrically insulating material, for example Epoxy FR4 or Vetronit®. In order to comply with the accordingly required standards, the insulation materials used should be UL-listed and tested according to the class UL94 V-0. The insulation plate 5 has a cutout 51 which is open to the side and is used to guide through the current sensor 421. A passage opening 52 present in the insulation plate 5 is used to guide through an electrical plug connection 427, 613 between the second and third printed circuit boards 42, 61. Screw holes 53 are also present in the insulation plate 5 in order to fasten the latter to the second printed circuit board 42 and the third printed circuit board 61.

Figure 7:
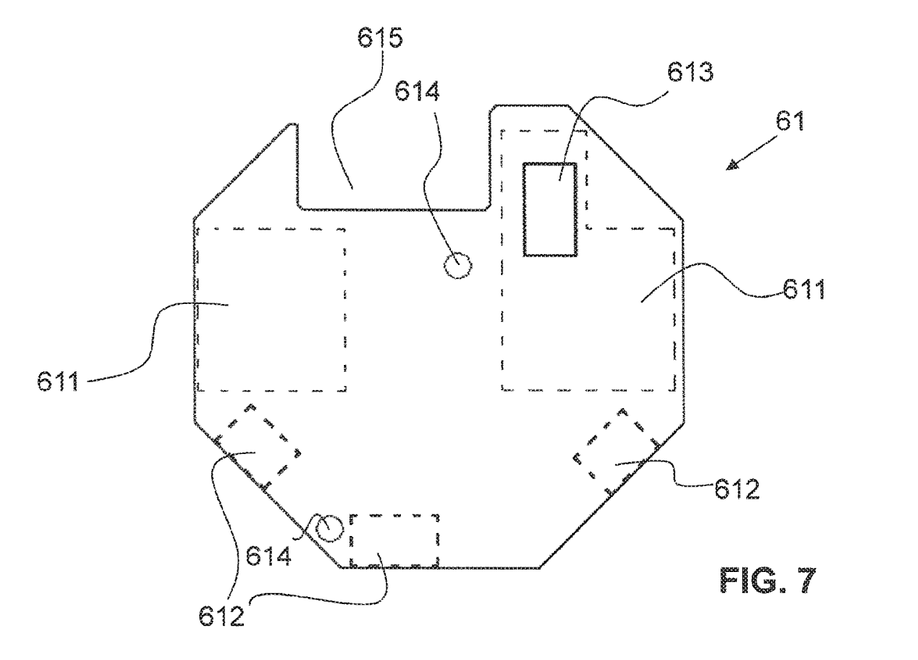
FIG. 7 shows a plan view from the front of the third printed circuit board of the automation module from FIG. 1.

FIG. 7 shows the third printed circuit board 61 which is arranged in the nigh-voltage region 6. In order to achieve a compact automation module, only a few electronic components, in particular flat electronic components, are advantageously mounted on the third printed circuit board 61 in addition to the connecting plug 613 on that side of the printed circuit board which faces the insulation plate 5. A multiplicity of relay switches 611 are arranged on the rear side of the third printed circuit board 61. The relay switches 611 form the actuators of the automation module which are used to switch the loads connected thereto, for example lamps or roller blinds. In order to connect these loads to the automation module, a plurality of connection terminals 612 are arranged on the rear side of the third printed circuit board 61. The relay switches 611 may be configured, for example, to switch currents of 5 A, 10 A or 16 A.

A rectangular cutout 615 which is open at the side is used to guide through the current sensor 421. The power supply cable of the respective automation module can be guided through the passage opening of the current sensor 421 which is arranged at the level of the connection terminals 612, with the result that the power consumption of the loads can be recorded by the automation module. Screw holes 614 are used to fasten the third printed circuit board 61 to the insulation plate 5 and to the second printed circuit board 42.

The individual automation module shown in FIGS. 1 to 7 is usually part of a building automation apparatus which may have a multiplicity of further automation modules of this type which are generally connected to one another via a data bus. A central unit which can undertake the function of a central, superordinate controller of the various automation modules may also be, but need not be, part of the building automation apparatus. The central unit may additionally or alternatively also be provided for establishing a wireless or GSM connection to one or more control devices. The control device may be a smartphone or a tablet computer, in particular.

It goes without saying that the invention described here is not restricted to the embodiments mentioned and a multiplicity of modifications are possible. For example, the insulation plate 5 may also be omitted as long as sufficient electrical insulation is ensured between the second and third printed circuit boards 42, 61, for example on account of a sufficiently large distance. Instead of an additional button module, a touchscreen or a user interface of any other desired design on the automation module could also be connected to the connection terminals 414 of the printed circuit board 41' or to the service interface 424 of the second printed circuit board 42. A multiplicity of further modifications are conceivable.

The invention claimed is:

1. An automation module for building automation, which is designed for at least partial flush-mounted installation in a wall of a house, comprising:
   a high-voltage region;
   a low-voltage region;
   an insulation region comprising an insulation plate for separating the high-voltage region from the low-voltage region;
   a first printed circuit board having at least one input interface;
   a second printed circuit board having at least one control unit; and
   a third printed circuit board having at least one switching element;
   wherein the first, second and third printed circuit boards and the insulation region are arranged above one another in layers;
   wherein, a current sensor is mounted on the first or second printed circuit board; and
   wherein the insulation plate has a cutout through which the current sensor projects.

2. The automation module as claimed in claim 1, wherein the insulation region is arranged between the second and third printed circuit boards.

3. The automation module as claimed in claim 2, wherein the second and third printed circuit boards each comprise electronic components, and wherein these electronic components are largely arranged on those sides of the second and third printed circuit boards which are opposite to the insulation region.

4. The automation module as claimed in claim 1, wherein at least one of at least one service and programming interface is provided on the second printed circuit board, and wherein the first printed circuit board comprises at least one continuous access opening which allows access to at least one of the service and programming interface.

5. The automation module as claimed in claim 1, wherein the first, second and third printed circuit boards are each connected to one another by means of accordingly provided electrical plug connections.

6. The automation module as claimed in claim 5, wherein the electrical plug connections comprise connecting plugs and connecting sockets, and wherein the first, second and third printed circuit boards can each be separated from one another in a non-destructive manner by releasing the electrical plug connections between the connecting plugs and the connecting sockets.

7. The automation module as claimed in claim 1, wherein a connection for a data bus which is used to network a plurality of automation modules is provided on the first, second or third printed circuit board.

8. The automation module as claimed in claim 7, wherein the connection for a data bus is provided on the first printed circuit board.

9. The automation module as claimed in claim 1, wherein the first, second and third printed circuit boards each have substantially an octagonal form.

10. The automation module as claimed in claim 1, wherein a housing having a continuous housing opening laterally surrounds the first, second and third printed circuit boards.

11. The automation module as claimed in claim 10, wherein the housing has an octagonal form.

12. The automation module as claimed in claim 1, wherein the third printed circuit board has a larger diameter than the first and second printed circuit boards.

13. The automation module as claimed in claim 12, wherein the housing comprises, in the region of the third printed circuit board, a groove which extends on an inner side of the housing along a circumferential direction of the housing, and wherein the groove is used to accommodate the third printed circuit board.

14. A building automation apparatus comprising at least one automation module as claimed in claim 1.

15. The automation module as claimed in claim 1, wherein the current sensor is an inductive current sensor.

16. The automation module as claimed in claim 1, wherein the first printed circuit board and the second printed circuit board are arranged in the low-voltage region and the third printed circuit board is arranged in the high-voltage region.

* * * * *